(12) United States Patent
Park et al.

(10) Patent No.: US 7,476,924 B2
(45) Date of Patent: Jan. 13, 2009

(54) SEMICONDUCTOR DEVICE HAVING RECESSED LANDING PAD AND ITS METHOD OF FABRICATION

(75) Inventors: Je-Min Park, Gyeonggi-do (KR); Ho-Jin Oh, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/550,553

(22) Filed: Oct. 18, 2006

(65) Prior Publication Data

US 2007/0152257 A1 Jul. 5, 2007

(30) Foreign Application Priority Data

Oct. 18, 2005 (KR) .................... 10-2005-0098243

(51) Int. Cl.
*H01L 27/108* (2006.01)
(52) U.S. Cl. ..................... 257/308; 257/298
(58) Field of Classification Search ............ 257/308, 257/774, 753, 758, 666, 306, 300, 381, 363, 257/296, 298, 303, E21.658, E21.578, E21.593, 257/E27.086
See application file for complete search history.

(56) References Cited

U.S. PATENT DOCUMENTS

| | | | | |
|---|---|---|---|---|
| 6,040,627 A * | 3/2000 | Harada et al. | ................ | 257/752 |
| 6,136,643 A | 10/2000 | Jeng et al. | | |
| 6,153,901 A * | 11/2000 | Higashi | .................... | 257/301 |
| 6,265,262 B1 * | 7/2001 | Okuno et al. | ................ | 438/253 |
| 6,593,217 B1 | 7/2003 | Fujisawa | | |
| 2002/0105089 A1 * | 8/2002 | Tanaka | .................. | 257/774 |
| 2007/0155150 A1 * | 7/2007 | Kim | .................. | 438/597 |

FOREIGN PATENT DOCUMENTS

| | | |
|---|---|---|
| JP | 2002-299436 | 10/2002 |
| KR | 2001-0011196 | 2/2001 |
| KR | 2001-0028057 | 4/2001 |

OTHER PUBLICATIONS

English language abstract for Korean Publication No. 2001-0011196.
English language abstract for Korean Publication No. 2001-0028057.
English language abstract for Japanese Publication No. 2002-299436.

* cited by examiner

*Primary Examiner*—Thomas L Dickey
*Assistant Examiner*—Fazli Erdem
(74) *Attorney, Agent, or Firm*—Marger Johnson & McCollom, P.C.

(57) ABSTRACT

A semiconductor device having a recessed landing pad includes a semiconductor substrate and a lower interlayer dielectric layer disposed on the semiconductor substrate. A first landing pad is disposed through the lower interlayer dielectric layer to be in contact with the semiconductor substrate. A second landing pad is disposed through the lower interlayer dielectric layer to also be in contact with the semiconductor substrate. A metal silicide layer is disposed on the second landing pad. The metal silicide layer is disposed lower than a top surface of the first landing pad. An intermediate interlayer dielectric layer is disposed on the lower interlayer dielectric layer. A conductive line is disposed on the intermediate interlayer dielectric layer. A contact plug is disposed between the conductive line and the metal silicide layer. A designed contact area between the metal silicide layer and the contact plug is protected against inadvertent etching.

11 Claims, 11 Drawing Sheets

SEMICONDUCTOR DEVICE HAVING RECESSED LANDING PAD AND ITS METHOD OF FABRICATION

CROSS-REFERENCE TO RELATED APPLICATION

This application claims the benefit of Korean Patent Application No. 2005-98243, filed Oct. 18, 2005, the disclosure of which is hereby incorporated herein by reference in its entirety.

BACKGROUND

1. Field of the Invention

The present invention relates to a semiconductor device and a method of its fabrication, and more particularly, to a semiconductor device having a recessed landing pad and a method of its fabrication.

2. Description of the Related Art

As the integration density and operation speed of memory devices such as a Dynamic Random Access Memory (DRAM) continue to increase, it becomes necessary to reduce contact resistance and resistance of a bit line. Conventionally, a metal material like tungsten is used for the bit line. However, the bit line is connected to a lower conductive pattern such as a landing pad via a contact plug, and polysilicon is widely used for a film forming material of the landing pad. To reduce the contact resistance, a technique of forming metal silicide between the contact plug and the landing pad has been researched.

FIGS. 1 to 3 are process cross-sectional views illustrating a conventional method of fabricating a semiconductor device having a bit line and a metal silicide layer.

Referring to FIG. 1, an isolation layer 13 is formed in a semiconductor substrate 11 to define an active region 12. A lower interlayer dielectric layer 15 is formed on the entire surface of the semiconductor substrate 11 having the isolation layer 13. First and second landing pads 16 and 17 are formed through the lower interlayer dielectric layer 15 to be in contact with the active region 12. The landing pads 16 and 17 are formed of a polysilicon layer. Top surfaces of the lower interlayer dielectric layer 15 and the landing pads 16 and 17 are exposed on substantially the same plane.

An intermediate interlayer dielectric layer 25 is formed on the entire surface of the semiconductor substrate 11 having the landing pads 16 and 17. A bit line contact hole is formed through the intermediate interlayer dielectric layer 25 to expose the second landing pad 17. A plug spacer 21 is formed on sidewalls of the bit line contact hole. Subsequently, a silicidation process is carried out to form a metal silicide layer 18 in the second landing pad 17 exposed on a bottom surface of the bit line contact hole. As a result, the second landing pad 17 and the metal silicide layer 18 are sequentially stacked to constitute a bit line pad 19. In this case, a top surface of the metal silicide layer 18 is disposed on substantially the same plane as the top surface of the lower interlayer dielectric layer 15 and the top surface of the first landing pad 16.

Subsequently, a metal layer is formed, which fills the bit line contact hole and covers the intermediate interlayer dielectric layer 25. The metal layer may be formed of a tungsten layer and patterned to form a bit line 29. As a result, bit line plugs 23 are formed in the bit line contact hole. The bit line 29 is electrically connected to the bit line pad 19 via the bit line plug 23. A bit line spacer 27 is formed on sidewalls of the bit line 29. An upper interlayer dielectric layer 35 is formed on the entire surface of the semiconductor substrate 11 having the bit line 29.

Referring to FIG. 2, the upper interlayer dielectric layer 35 and the intermediate interlayer dielectric layer 25 are sequentially patterned to form a storage node contact hole 37, which exposes the first landing pad 16. An isotropic etching process is then carried out to expand the storage node contact hole 37.

While the storage node contact hole 37 is expanded, the lower interlayer dielectric layer is partially etched to be recessed downward. In addition, the metal silicide layer 18 is partially exposed. In general, the metal silicide layer 18 has a high etching rate with respect to the isotropic etching process. In this case, the metal silicide layer 18 is also partially etched by the isotropic etching process to form an air gap 18H. Consequently, a contact area between the bit line plugs 23 and the metal silicide layer 18 is significantly reduced by the air gap 18H.

Referring to FIG. 3 an insulating spacer 39 is formed on sidewalls of the expanded storage node contact hole 37. The insulating spacer 39 is formed of an insulating layer such as a silicon nitride layer. While the insulating spacer 39 is formed, the insulating layer also penetrates into the air gap 18H to form a contact barrier layer 18S.

A storage node plug 41 is then formed to fill the expanded storage node contact hole 37. A storage node 43 is formed on the storage node plug 41.

According to the conventional method of fabricating the semiconductor device as described above, a contact resistance between the bit line plugs 23 and the metal silicide layer 18 increases due to the contact barrier layer 18S. In addition it is difficult to control the contact resistance between the bit line plugs 23 and the metal silicide layer 18.

Other methods of forming a contact plug are disclosed in U.S. Pat. No. 6,136,643 entitled "Method For Fabricating Capacitor-Over-Bit-Line Dynamic Random Access Memory Using Self-Aligned Contact Etching Technology" to Jeng, et al., and are disclosed in U.S. Pat. No. 6,593,217 entitled "Method Of Manufacturing Semiconductor Device" to Fujisawa.

But even so, improved techniques of controlling a contact resistance between a bit line and a lower conductive pattern are still needed.

SUMMARY

An embodiment provides a semiconductor device capable of controlling a contact resistance between a bit line and a lower conductive pattern.

Another embodiment provides a method of fabricating a semiconductor device capable of controlling a contact resistance between a bit line and a lower conductive pattern.

In one aspect, embodiments are directed to a semiconductor device having a recessed landing pad. In an example of these embodiments, the semiconductor device includes a semiconductor substrate and a lower interlayer dielectric layer disposed on the semiconductor substrate. A first landing pad is disposed through the lower interlayer dielectric layer to be in contact with the semiconductor substrate. A second landing pad is disposed through the lower interlayer dielectric layer to be in contact with the semiconductor substrate. The second landing pad is spaced apart from the first landing pad. A metal silicide layer is disposed on the second landing pad. The metal silicide layer is disposed lower than a top surface of the first landing pad. An intermediate interlayer dielectric layer is disposed on the lower interlayer dielectric layer. A conductive line is disposed on the intermediate interlayer dielectric layer. A contact plug is disposed between the conductive line and the metal silicide layer.

In some embodiments, a plug spacer may be disposed to surround sidewalls of the contact plug. The plug spacer may penetrate the intermediate interlayer dielectric layer along sidewalls of the contact plug to extend into the lower interlayer dielectric layer. The plug spacer may be a material layer having an etch selectivity with respect to the intermediate interlayer dielectric layer and the lower interlayer dielectric layer.

In other embodiments, the contact plug may have an upper plug and a lower plug. The upper plug may penetrate the intermediate interlayer dielectric layer. The lower plug may extend below the upper plug and may be disposed in the lower interlayer dielectric layer. The lower plug may have a width larger than the upper plug. In addition, the lower plug may have a spherical shape. Further, sidewalls of the upper plug and sidewalls and a bottom surface of the lower plug may be surrounded by a barrier metal layer.

In still other embodiments, the metal silicide layer may be a material layer selected from the group consisting of WSi, TiSi, CoSi, NiSi, MoSi, ZrSi, PtSi, IrSi, and TaSi.

In yet other embodiments, an upper interlayer dielectric layer may be disposed to cover the conductive line and the intermediate interlayer dielectric layer. A storage node may be disposed on the upper interlayer dielectric layer. A node contact plug may be disposed between the first landing pad and the storage node. Sidewalls of the node contact plug may be surrounded by a node contact spacer.

In another aspect, embodiments are directed to a method of fabricating a semiconductor device having a recessed landing pad. In an example of these embodiments, the method includes preparing a semiconductor substrate and forming a lower interlayer dielectric layer on the semiconductor substrate. A first landing pad and a second landing pad are formed through the lower interlayer dielectric layer to be in contact with the semiconductor substrate. The first and second landing pads are spaced apart from each other. An intermediate interlayer dielectric layer is formed on the lower interlayer dielectric layer. A contact hole is formed to penetrate the intermediate interlayer dielectric layer and extend into the second landing pad. A metal silicide layer is formed below the contact hole. The metal silicide layer is formed lower than a top surface of the first landing pad. A contact plug is formed to fill the contact hole.

In some embodiments, forming the contact hole may include forming an upper contact hole penetrating the intermediate interlayer dielectric layer to expose the second landing pad, and partially etching the second landing pad to form a lower contact hole extending below the upper contact hole. The lower contact hole may have a width larger than the upper contact hole. In addition, the lower contact hole may have a spherical shape. In this case, etching the second landing pad may be carried out by an isotropic etching process until the lower interlayer dielectric layer is exposed on the sidewall of the lower contact hole.

In other embodiments, a plug spacer may be formed on sidewalls of the contact hole. The plug spacer may be formed of a material layer having an etch selectivity with respect to the intermediate interlayer dielectric layer and the lower interlayer dielectric layer.

In yet other embodiments, forming the contact plug may include forming a plug conductive layer which fills the contact hole and covers the intermediate interlayer dielectric layer, and planarizing the plug conductive layer. The contact plug may have an upper plug penetrating the intermediate interlayer dielectric layer, and a lower plug extending below the upper plug and formed in the lower interlayer dielectric layer. The lower plug may have a width larger than the upper plug. In addition, the lower plug may have a spherical shape.

In yet other embodiments, a conductive line, which is in contact with the contact plug, may be formed on the intermediate interlayer dielectric layer. An upper interlayer dielectric layer may be formed to cover the conductive line and the intermediate interlayer dielectric layer. A node contact hole penetrating the upper interlayer dielectric layer and the intermediate interlayer dielectric layer may be formed to expose the first landing pad. An isotropic etching process may be employed to expand the node contact hole. A node contact spacer may be formed on sidewalls of the node contact hole. The node contact spacer may be formed of an insulating material layer. A node contact conductive layer may be formed to fill the node contact hole and cover the upper interlayer dielectric layer. The node contact conductive layer may be planarized to form a node contact plug. The node contact plug may penetrate the upper interlayer dielectric layer and the intermediate interlayer dielectric layer to be in contact with the first landing pad. A storage node, which is in contact with the node contact plug, may be formed on the upper interlayer dielectric layer.

BRIEF DESCRIPTION OF THE DRAWINGS

The foregoing and other objects, features and advantages of the invention will be apparent from the more particular descriptions of exemplary embodiments, as illustrated in the accompanying drawings. The drawings are not necessarily to scale, emphasis instead being placed upon illustrating the principles of the embodiments.

DETAILED DESCRIPTION

Figure 1:
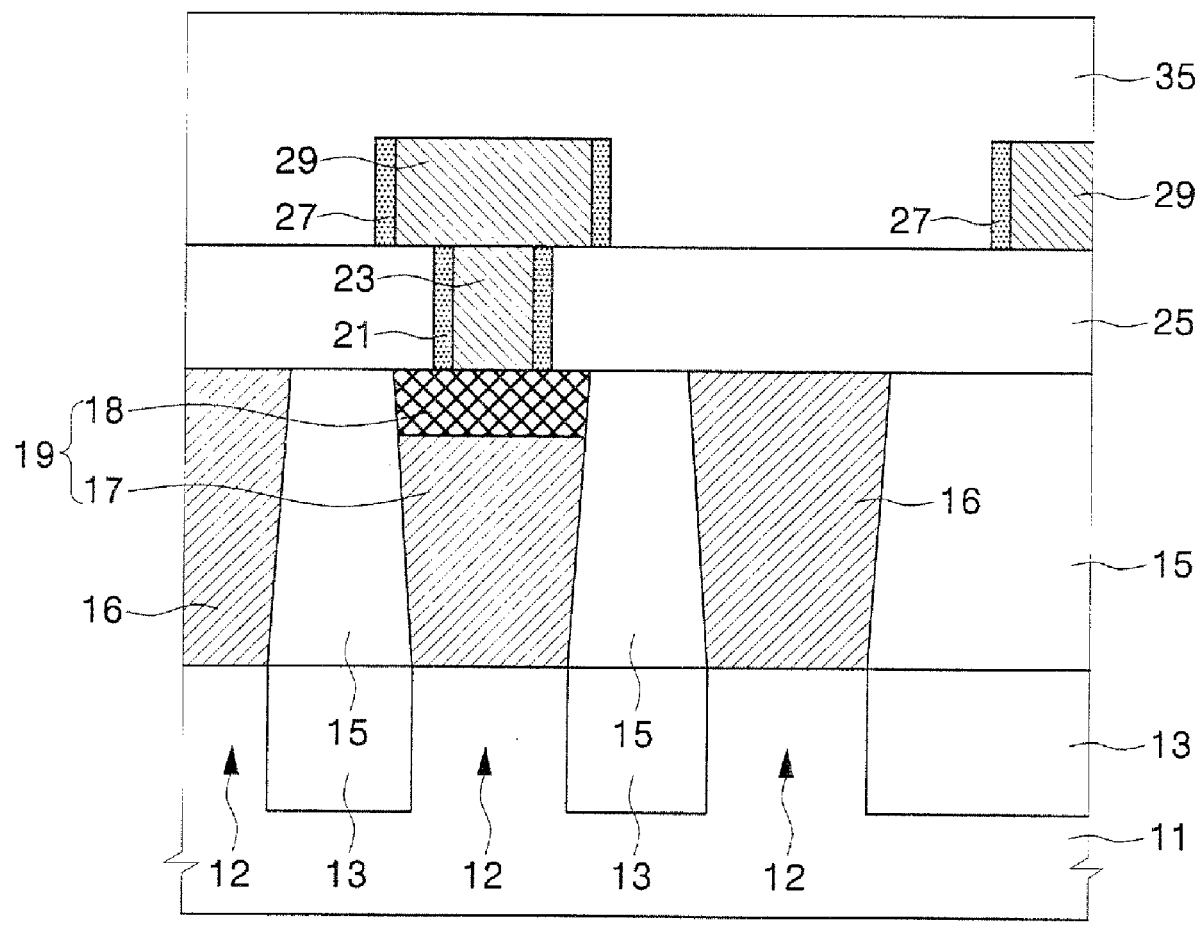
FIGS. 1 to 3 are process cross-sectional views illustrating a conventional method of fabricating a semiconductor device having a bit line and a metal silicide layer.
Figure 2:
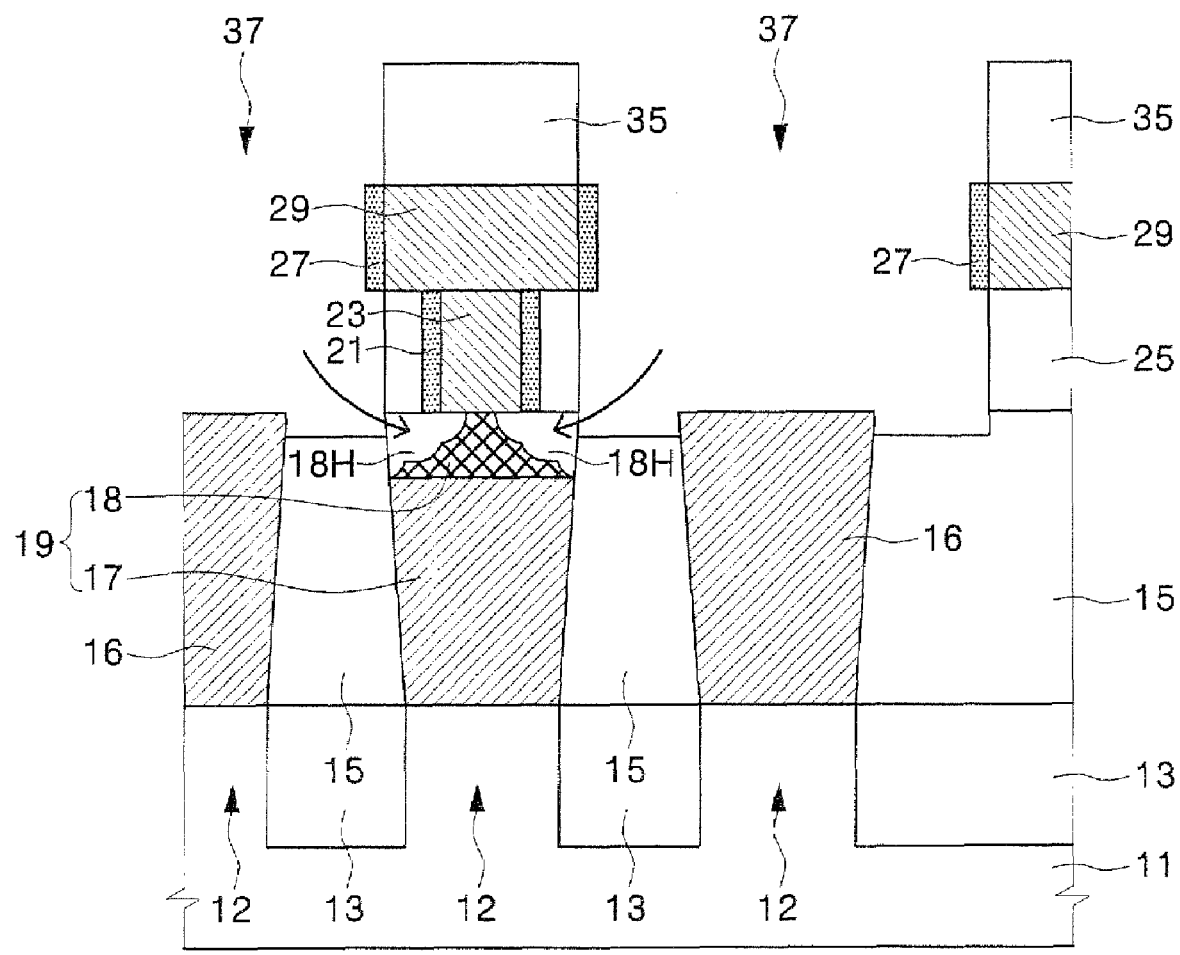

The present invention will now be described more fully hereinafter with reference to the accompanying drawings, in which exemplary embodiments are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. In addition, when a layer is described to be formed on another layer or on a substrate, this may mean that the layer may be formed on the other layer or on the substrate, or a third layer may be interposed between the layer and the other layer or the substrate, for example. Like numbers refer to like elements throughout the specification.

Figure 4:
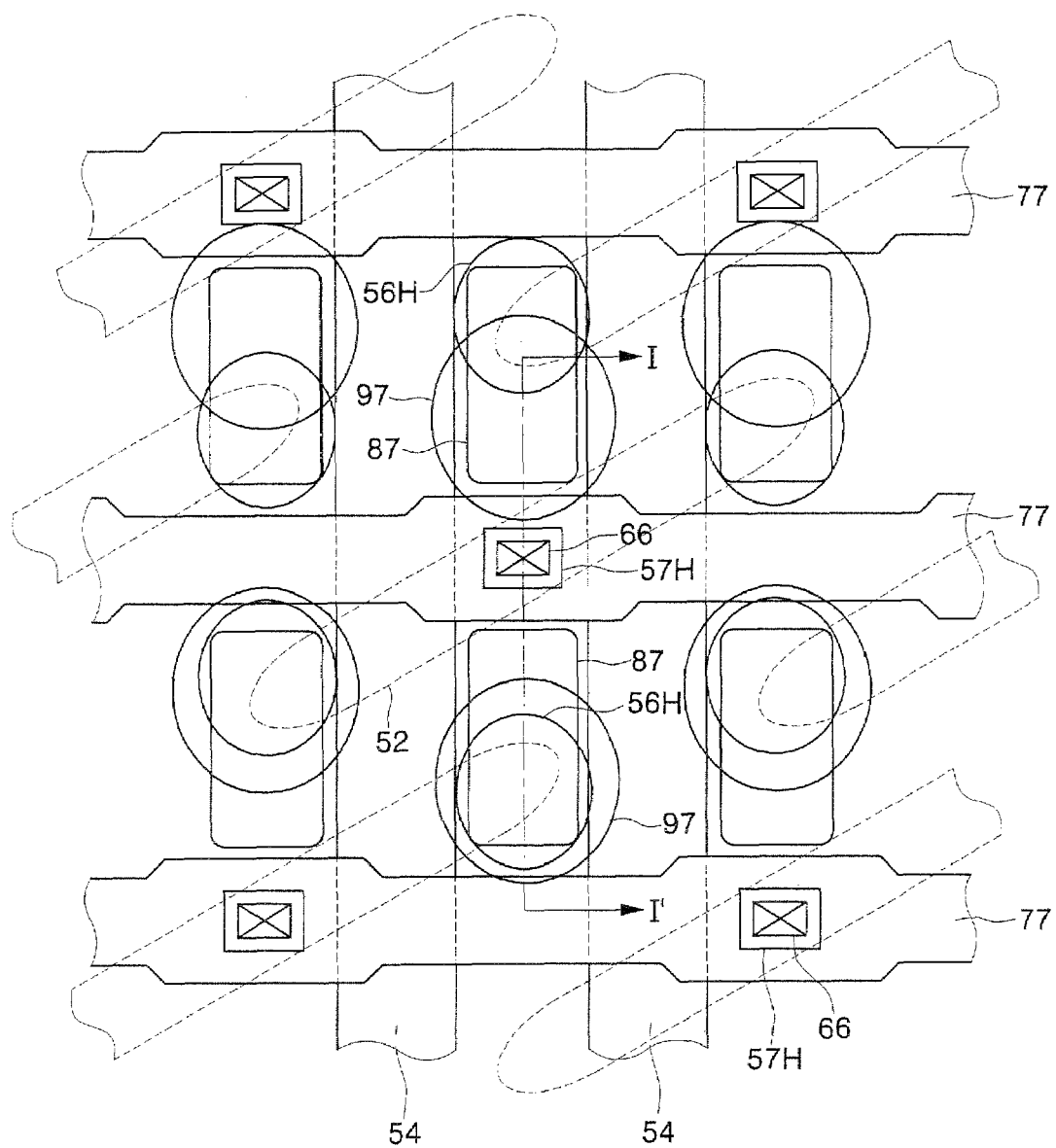
FIG. 4 is a plan view of a semiconductor device having a recessed landing pad in accordance with an exemplary embodiment.
Figure 5:
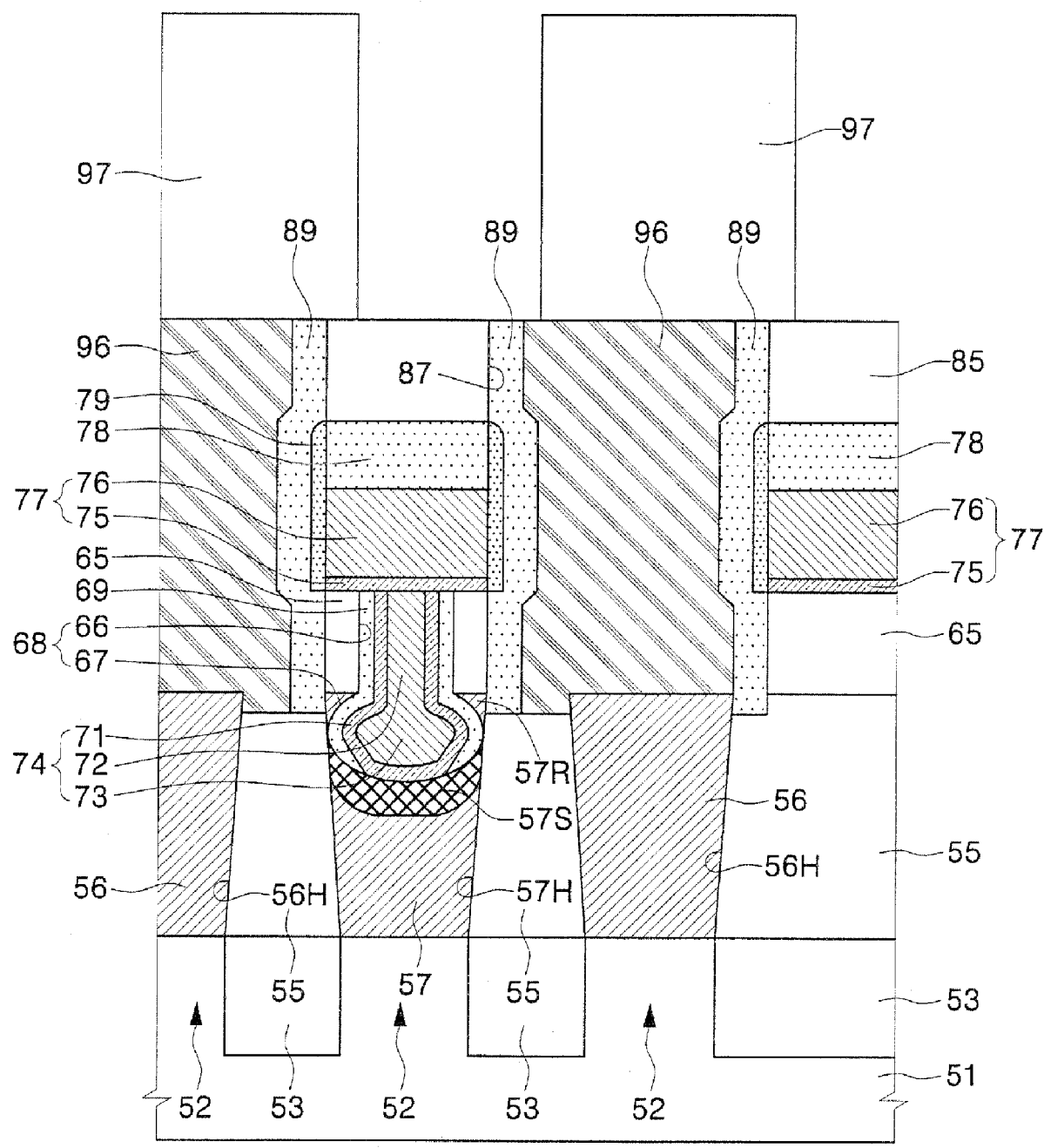
FIG. 5 is a cross-sectional view taken along line I-I' of FIG. 4 illustrating a semiconductor device having a recessed landing pad in accordance with an exemplary embodiment.
Figure 13:
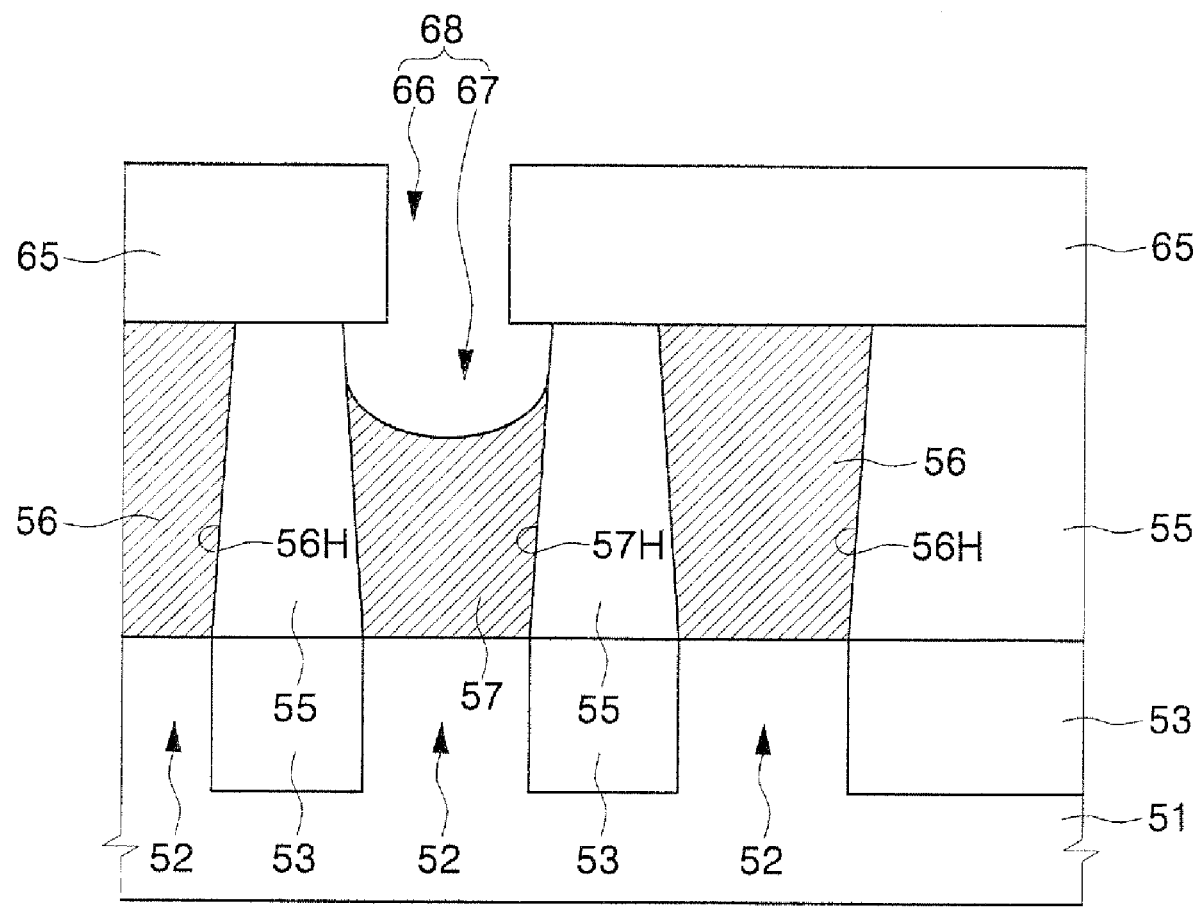
FIGS. 13 and 14 are cross-sectional views taken along line I-I' of FIG. 4 illustrating another method of fabricating a semiconductor device in accordance with an exemplary embodiment.
Figure 14:
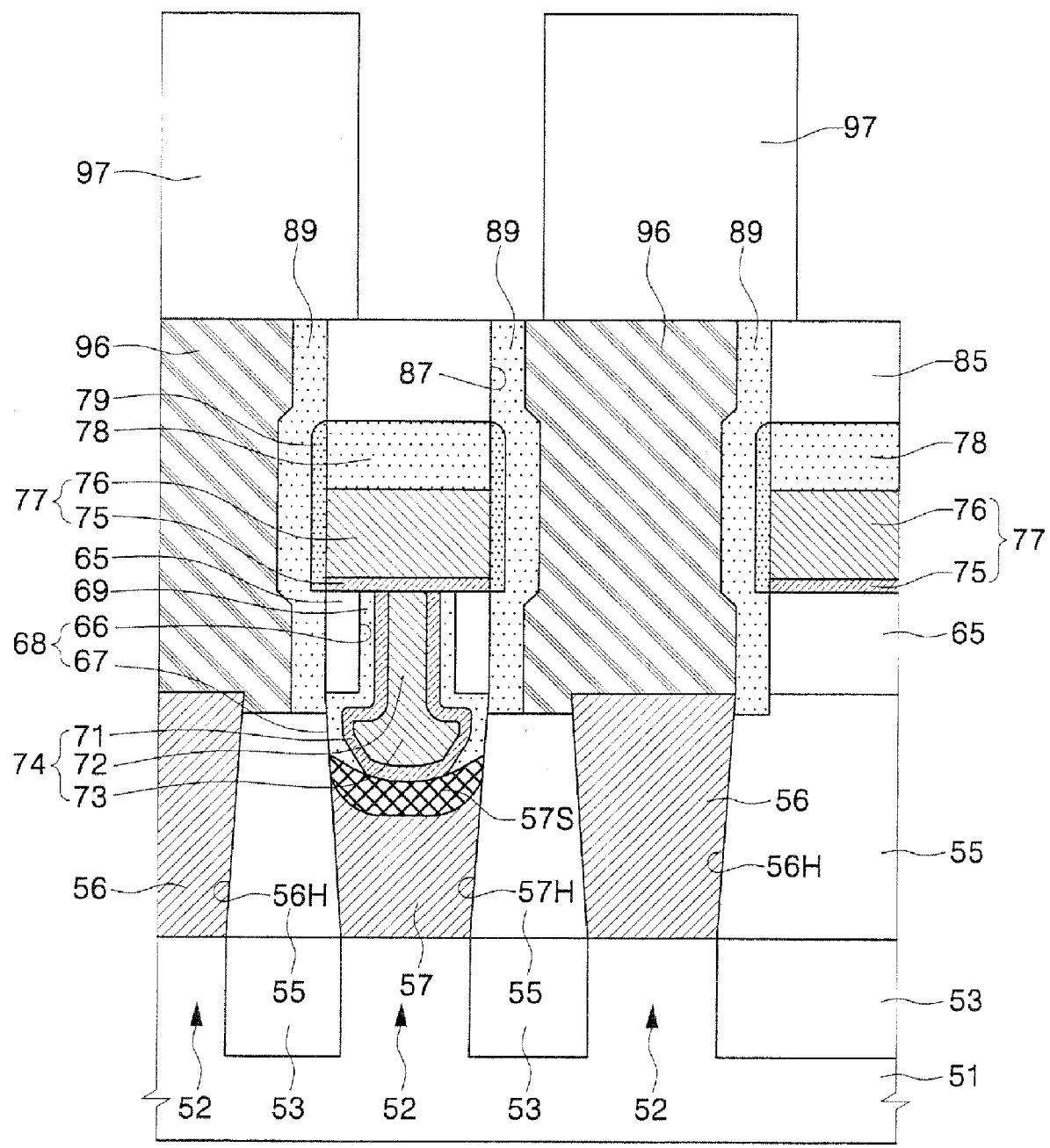

FIG. 4 is a plan view of a semiconductor device having a recessed landing pad in accordance with an exemplary embodiment. FIG. 5 is a cross-sectional view taken along line I-I' of FIG. 4 illustrating a semiconductor device having a recessed landing pad in accordance with an exemplary embodiment, and FIGS. 6 to 12 are cross-sectional views taken along line I-I' of FIG. 4 illustrating a method of fabricating a semiconductor device having a recessed landing pad in accordance with an exemplary embodiment. In addition, FIGS. 13 and 14 are cross-sectional views taken along line I-I' of FIG. 4 illustrating another method of fabricating a semiconductor device in accordance with an exemplary embodiment.

First, a semiconductor device having a recessed landing pad according to an exemplary embodiment will be described with reference to FIGS. 4 and 5.

Referring to FIGS. 4 and 5, an isolation layer 53 is disposed in the semiconductor substrate 51 to define an active region 52. The semiconductor substrate 51 may be a silicon wafer. The isolation layer 53 may be an insulating layer such as a High Density Plasma (HDP) oxide layer. Structures such as a word line 54 crossing over the active region 52 may be disposed, but they will be omitted for simplicity of description.

A lower interlayer dielectric layer 55 may be disposed on the semiconductor substrate 51 having the isolation layer 53, and may be a silicon oxide layer. A first landing pad 56 is disposed through the lower interlayer dielectric layer 55 to be in contact with the semiconductor substrate 51. In addition, a second landing pad 57 is also disposed through the lower interlayer dielectric layer 55 to be in contact with the semiconductor substrate 51. The second landing pad 57 is spaced apart from the first landing pad 56, and both landing pads 56 and 57 may be polysilicon layers. Top surfaces of the first landing pad 56 and the lower interlayer dielectric layer 55 may be in substantially the same plane. In contrast, the second landing pad 57 may be disposed lower than the top surface of the first landing pad 56.

In the present embodiment, a metal silicide layer 57S is disposed on the second landing pad 57 lower than the top surface of the first landing pad 56. The metal silicide layer 57S may be one selected from the group consisting of WSi, TiSi, CoSi, NiSi, MoSi, ZrSi, PtSi, IrSi, and TaSi.

An intermediate interlayer dielectric layer 65 may be disposed on the lower interlayer dielectric layer 55 and may be a silicon oxide layer. A conductive line 77 may be disposed on the intermediate interlayer dielectric layer 65. A contact plug 74 may be disposed between the conductive line 77 and the metal silicide layer 57S.

A plug spacer 69 may be disposed to surround sidewalls of the contact plug 74, and may penetrate the intermediate interlayer dielectric layer 65 along the sidewalls of the contact plug 74 to extend into the lower interlayer dielectric layer 55. Also, the plug spacer 69 may be in contact with the lower interlayer dielectric layer 55. The plug spacer 69 may be a material layer having an etch selectivity with respect to the intermediate interlayer dielectric layer 65 and the lower interlayer dielectric layer 55. For example, the plug spacer 69 may be a silicon nitride layer or a silicon oxynitride layer. The metal silicide layer 57S may be disposed below the plug spacer 69. In addition, a partially remaining landing pad 57R may partially remain on the metal silicide layer 57S.

The contact plug 74 may include an upper plug 72 and a lower plug 73. The upper plug 72 may penetrate the intermediate interlayer dielectric layer 65. The lower plug 73 may extend below the upper plug 72 and may be disposed in the lower interlayer dielectric layer 55. The lower plug 73 may have a width larger than the upper plug 72. In addition, the lower plug 73 may have a substantially spherical shape. In addition, sidewalls of the upper plug 72 and sidewalls and a bottom surface of the lower plug 73 may be surrounded by a barrier metal layer 71. The contact plug 74 may be a metal layer such as tungsten. The barrier metal layer 71 may be a titanium nitride layer (TiN), for example.

A hard mask pattern 78 may be disposed on the conductive line 77. The hard mask pattern 78 may be a silicon nitride layer. The conductive line 77 may act as a bit line. A bit line spacer 79 may be disposed on sidewalls of the hard mask pattern 78 and the conductive line 77. The conductive line 77 may be composed of a barrier metal layer 75 and a conductive layer 76, sequentially stacked. The conductive layer 76 may be a metal layer such as tungsten.

The conductive line 77 may be electrically connected to the semiconductor substrate 51 via the contact plug 74, the metal silicide layer 57S, and the second landing pad 57. In this case, the metal silicide layer 57S acts to reduce a contact resistance between the contact plug 74 and the second landing pad 57.

An upper interlayer dielectric layer 85 may be disposed to cover the conductive line 77 and the intermediate interlayer dielectric layer 65. The upper interlayer dielectric layer 85 may be a silicon oxide layer. In this case, the bit line spacer 79 may be a material layer having an etch selectivity with respect to the upper interlayer dielectric layer 85. For example, the bit line spacer 79 may be a silicon nitride layer.

A storage node 97 may be disposed on the upper interlayer dielectric layer 85. A node contact plug 96 may be disposed between the first landing pad 56 and the storage node 97. Sidewalls of the node contact plug 96 may be surrounded by a node contact spacer 89. The node contact spacer 89 may be a silicon oxide layer, a silicon nitride layer, a silicon oxynitride layer, or a combination layer thereof. The storage node 97 may be electrically connected to the semiconductor substrate 51 via the node contact plug 96 and the first landing pad 56.

Hereinafter, a method of fabricating a semiconductor device having a recessed landing pad according to an exemplary embodiment will be described with reference to FIGS. 4 and 6 to 12.

Figure 6:
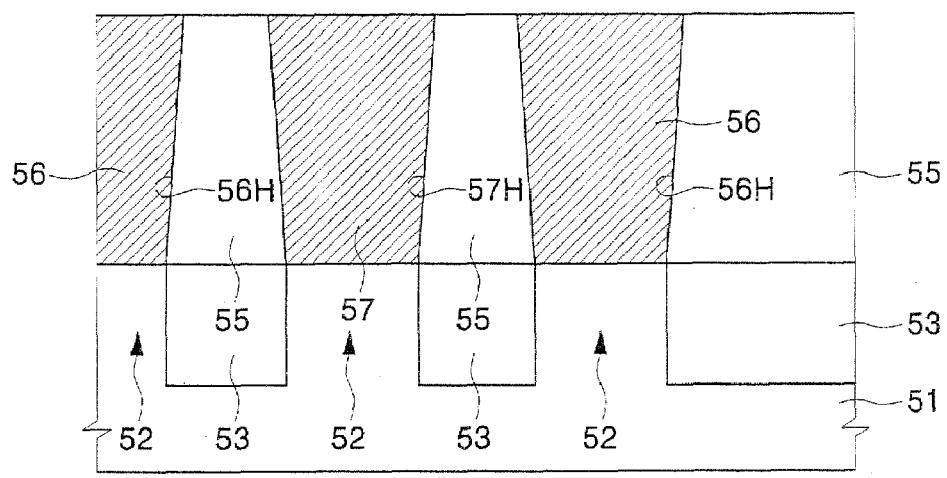
FIGS. 6 to 12 are cross-sectional views taken along line I-I' of FIG. 4 illustrating a method of fabricating a semiconductor device having a recessed landing pad in accordance with an exemplary embodiment.

Referring to FIGS. 4 and 6, an isolation layer 53 is disposed in a semiconductor substrate 51 to define an active region 52. The semiconductor substrate 51 may be a silicon wafer. The isolation layer 53 may be formed of an insulating layer such as a HDP oxide layer. Structures such as a word line 54 crossing over the active region 52 may be disposed, but their description will be omitted for simplicity.

A lower interlayer dielectric layer 55 is formed on the entire surface of the semiconductor substrate 51 having the isolation layer 53, and may be formed of a silicon oxide layer. The lower interlayer dielectric layer 55 is patterned to form first and second landing pad holes 56H and 57H, which partially expose the active region 52. The first landing pad hole 56H may act as a storage node landing pad hole, and the second landing pad hole 57H may act as a bit line landing pad hole.

A landing pad conductive layer is formed, which fills the first and second landing pad holes 56H and 57H and covers the entire surface of the semiconductor substrate 51. The landing pad conductive layer may be formed of a polysilicon layer. The landing pad conductive layer is planarized to form first and second landing pads 56 and 57, which penetrate the lower interlayer dielectric layer 55 and are in contact with the active region 52.

The first landing pad 56 may act as a storage node landing pad, and the second landing pad 57 may act as a bit line landing pad. A chemical mechanical polishing (CMP) process employing the lower interlayer dielectric layer 55 as a stopper may be applied to planarize the landing pad conductive layer. Alternatively, an etch-back process may be applied to planarize the landing pad conductive layer. Top surfaces of the lower interlayer dielectric layer 55 and the landing pads 56 and 57 may be exposed on substantially the same plane.

Figure 7:
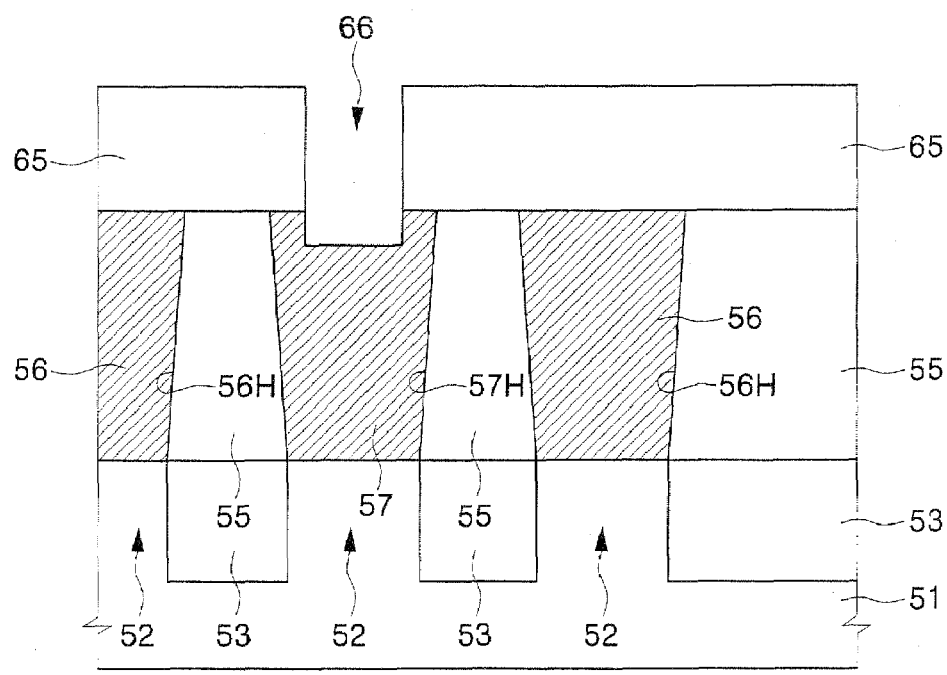

Referring to FIGS. 4 and 7, an intermediate interlayer dielectric layer 65 is formed on the entire surface of the semiconductor substrate 51 having the landing pads 56 and 57. The intermediate interlayer dielectric layer 65 may be formed of an insulating layer such as a silicon oxide layer.

The intermediate interlayer dielectric layer 65 is patterned to form an upper contact hole 66, which partially exposes the second landing pad 57. The upper contact hole 66 may act as an upper bit line contact hole. The upper contact hole 66 may penetrate the intermediate interlayer dielectric layer 65 to partially expose a top surface of the second landing pad 57.

While the upper contact hole 66 is formed, an upper region of the second landing pad 57 may be partially etched to be recessed downward. In this case, a bottom surface of the upper contact hole 66 may be lower than the top surface of the second landing pad 57.

Figure 8:
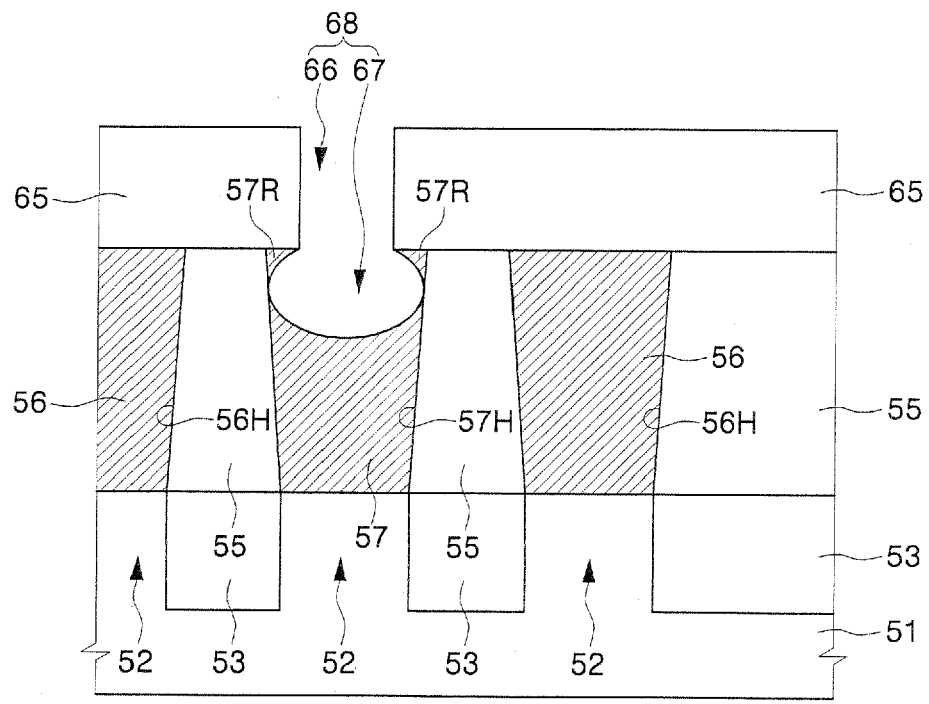

Referring to FIGS. 4 and 8, the exposed upper region of the second landing pad 57 is selectively removed to form a lower contact hole 67 larger than the upper contact hole 66. The lower contact hole 67 may act as a lower bit line contact hole. An isotropic etching process may be applied to selectively remove the exposed upper region of the second landing pad 57. For example, the isotropic etching process may include a process condition which can remove by etching a film-forming material of the second landing pad 57, i.e., a polysilicon layer, by 5 nm or more.

While the lower contact hole 67 is formed, the second landing pad 57 may partially remain on an upper corner region of the second landing pad hole 57H. In this case, the lower contact hole 67 may have a substantially spherical shape. Alternatively, the partially remaining landing pad 57R may be completely removed.

In addition, the lower contact hole 67 preferably exposes sidewalls of the second landing pad hole 57H. That is, the lower interlayer dielectric layer 55 may be exposed on the sidewalls of the second landing pad hole 57H by the lower contact hole 67. In this case, the second landing pad 57 and the partially remaining landing pad 57R are separated from each other by the lower contact hole 67.

As a result, the upper contact hole 66 and the lower contact hole 67 may be connected to each other to constitute a contact hole 68. As shown in the same figure, the contact hole 68 may have a flask shape. In addition, the second landing pad 57 may remain below the contact hole 68.

Figure 9:
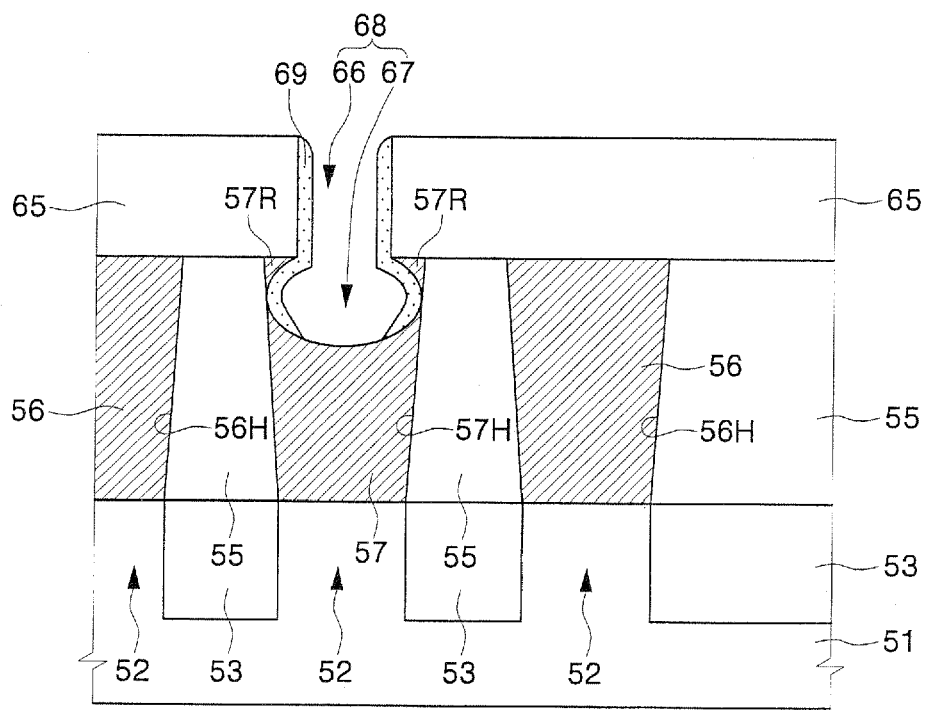

Referring to FIGS. 4 and 9, a plug spacer 69 may be formed on sidewalls of the contact hole 68.

In detail, an insulating layer is formed to cover the intermediate interlayer dielectric layer 65 and an inner wall of the contact hole 68. The insulating layer may be anisotropically etched to form the plug spacer 69 until the second landing pad 57 is exposed on a bottom surface of the contact hole 68. The plug spacer 69 is preferably formed of a material layer having an etch selectivity with respect to the intermediate interlayer dielectric layer 65 and the lower interlayer dielectric layer 55. For example, the plug spacer 69 may be formed of a silicon nitride layer or silicon oxynitride layer. The plug spacer 69 may be formed to a thickness of 1 nm to 50 nm, for example.

As described above, the lower interlayer dielectric layer 55 is exposed on the sidewalls of the second landing pad hole 57H by the lower contact hole 67. In this case, the plug spacer 69 may be formed on the exposed lower interlayer dielectric layer 55.

Figure 10:
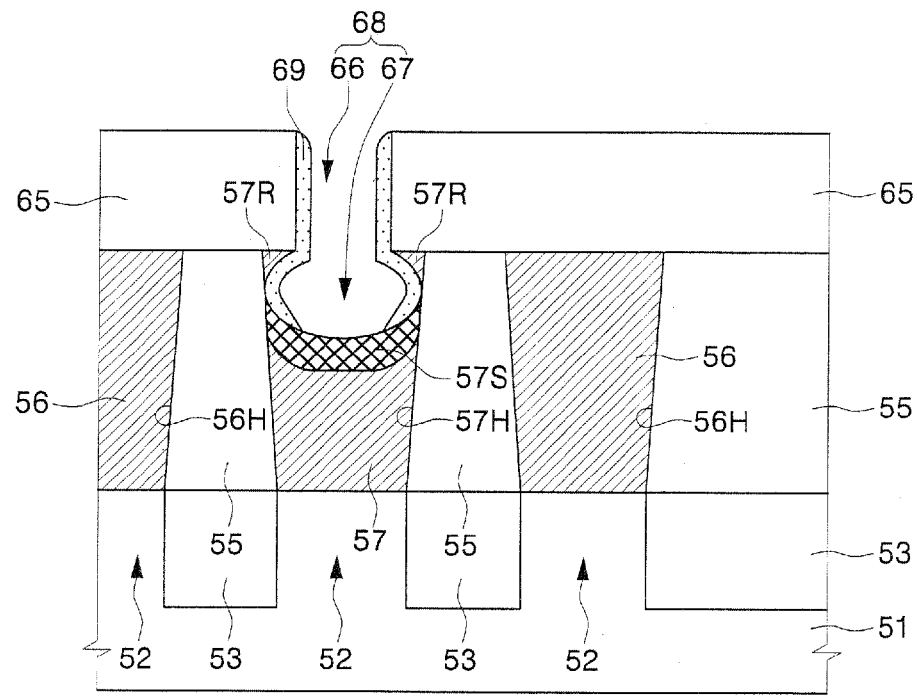

Referring to FIGS. 4 and 10, a silicidation process is employed to form a metal silicide layer 57S in the second landing pad 57 below the lower contact hole 67.

In detail, a metal layer and a capping layer may be sequentially deposited to cover the intermediate interlayer dielectric layer 65 and the inner wall of the contact hole 68. The metal layer may be formed of one selected from the group consisting of W, Ti, Co, Ni, MO, Zr, Pt, Ir, Ta, and a mixture thereof. The capping layer may be formed of TiN. Alternatively, the capping layer may be omitted. The semiconductor substrate 51 having the metal layer is annealed to form the metal silicide layer 57S. The annealing may be performed several times. Subsequently, a metal layer, which does not react during the annealing, and the capping layer are removed. As a result, the metal silicide layer 57S may be formed of a silicide layer containing one selected from the group consisting of W, Ti, Co, Ni, Mo, Zr, Pt, Ir, Ta, and a mixture thereof. For example, the metal silicide layer 57S may be formed of WSi, TiSi, CoSi, NiSi, MoSi, ZrSi, PtSi, IrSi, or TaSi.

While the silicidation process is carried out, the plug spacer 69 may act to prevent the metal silicide layer 57S from being excessively formed. Accordingly, the metal silicide layer 57S may be locally formed in the second landing pad 57. That is, the top surface of the metal silicide layer 57S may be formed lower than the top surfaces of the lower interlayer dielectric layer 55 and the first landing pad 56.

Figure 11:
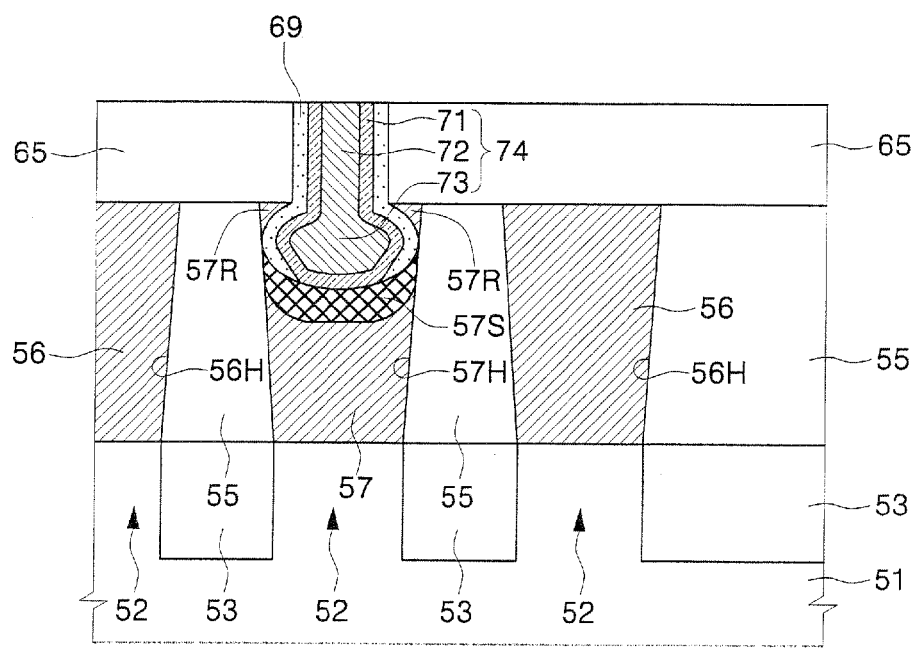

Referring to FIGS. 4 and 11, a contact plug 74 may be formed in the contact hole 68.

Specifically, a barrier metal layer 71 and a plug conductive layer may be sequentially deposited to fill the contact hole 68 and cover the intermediate interlayer dielectric layer 65. The barrier metal layer 71 may be formed of TiN. The plug conductive layer may be formed of a metal layer such as a tungsten (W) layer. The barrier metal layer 71 and the plug conductive layer may be planarized to form the contact plug 74. A CMP process employing the intermediate interlayer dielectric layer 65 as a stopper may be applied for the planarization. Alternatively, an etch-back process may be applied for the planarization. As a result, top surfaces of the contact plug 74 and the intermediate interlayer dielectric layer 65 may be exposed on substantially the same plane.

The contact plug 74 may include an upper plug 72 and a lower plug 73. The upper plug 72 is formed in the upper contact hole 66, and the lower plug 73 is formed in the lower contact hole 67. The upper plug 72 is in contact with the lower plug 73. The lower plug 73 may have a width larger than the upper plug 72.

Further, the lower plug 73 may have a substantially spherical shape. Sidewalls of the upper plug 72 and sidewalls and a bottom surface of the lower plug 73 may be surrounded by the barrier metal layer 71. In this case, the contact plug 74 may include the barrier metal layer 71, the upper plug 72, and the lower plug 73. Alternatively, the barrier metal layer 71 may be omitted. In addition, the contact plug 74 is in contact with the metal silicide layer 57S. The contact plug 74 may act as a bit line plug.

Figure 12:
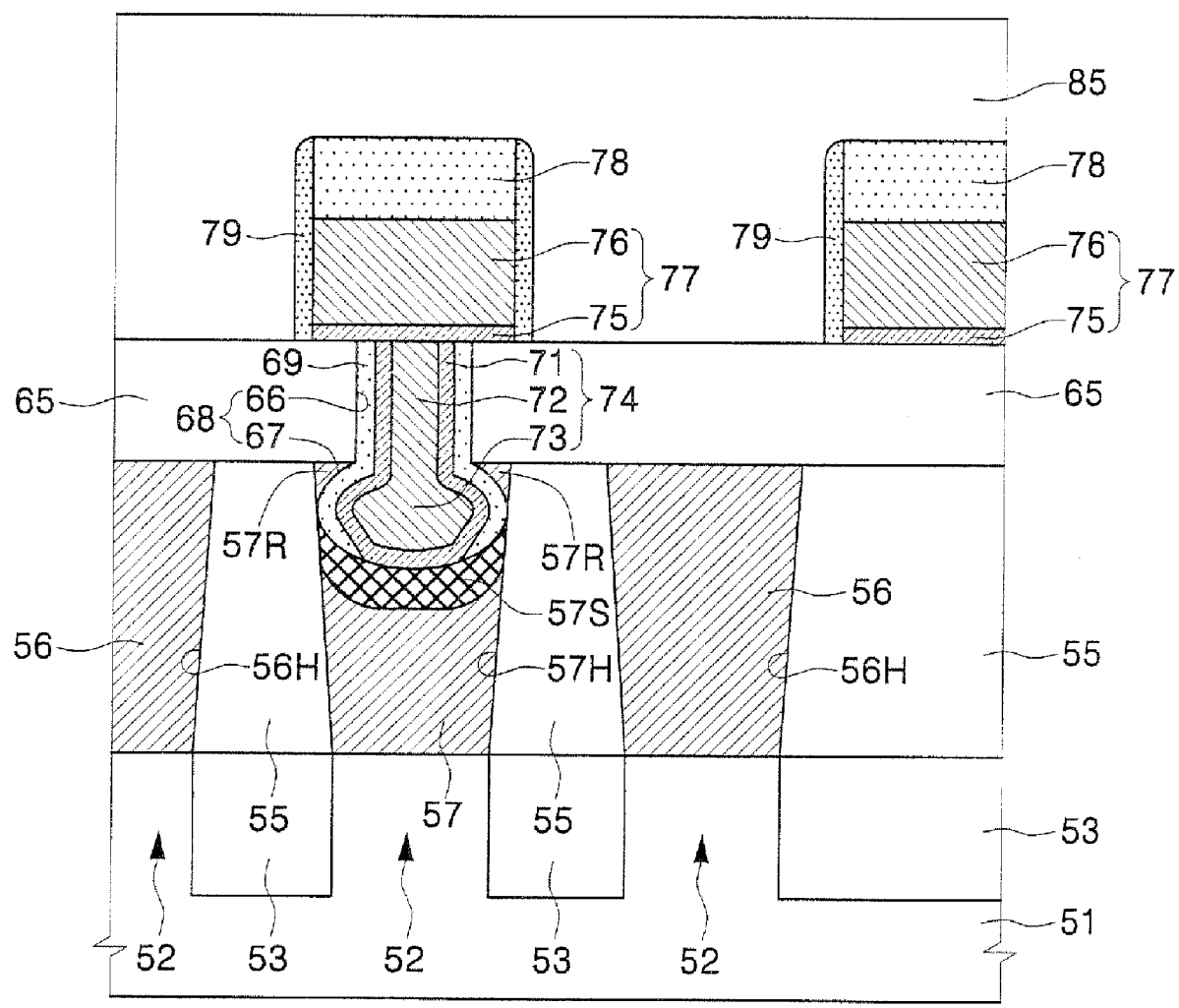

Referring to FIGS. 4 and 12, a conductive line 77 is formed on the intermediate interlayer dielectric layer 65 having the contact plug 74. The conductive line 77 is in contact with the contact plug 74. The conductive line 77 may act as a bit line.

Specifically, a barrier metal layer 75 and a conductive layer 76 may be sequentially deposited on the intermediate interlayer dielectric layer 65 having the contact plug 74. The barrier metal layer 75 may be formed of TiN. The conductive layer 76 may be formed of a W layer. A hard mask pattern 78 may be formed on the conductive layer 76 and may be formed of a silicon nitride layer. The conductive layer 76 and the barrier metal layer 75 may be sequentially etched using the hard mask pattern 78 as an etch mask to form the conductive line 77. Alternatively, the barrier metal layer 71 may be omitted.

Alternatively, the contact plug 74 and the conductive line 77 may be simultaneously formed. For example, after the barrier metal layer 71 and the plug conductive layer are sequentially deposited to fill the contact hole 68 and cover the intermediate interlayer dielectric layer 65, the hard mask pattern 78 may be formed on the plug conductive layer. The plug conductive layer and the barrier metal layer 71 may be sequentially etched using the hard mask pattern 78 as an etch mask to form the conductive line 77 and the contact plug 74.

A bit line spacer 79 may be formed on sidewalls of the conductive line 77. The bit line spacer 79 may be formed by forming a silicon nitride layer on the semiconductor substrate 51 having the conductive line 77 by a chemical vapor deposition (CVD) method and then anisotropically etching the silicon nitride layer until the intermediate interlayer dielectric layer 65 is exposed.

An upper interlayer dielectric layer 85 is formed on the semiconductor substrate 51 having the conductive line 77 and the bit line spacer 79. The upper interlayer dielectric layer 85 may cover the conductive line 77. The upper interlayer dielectric layer 85 may be formed of an insulating layer such as a silicon oxide layer.

Referring to FIGS. 4 and 5, the upper interlayer dielectric layer 85 and the intermediate interlayer dielectric layer 65 are patterned to form a node contact hole 87, which exposes the first landing pad 56. Subsequently, an isotropic etching process may be performed to expand the node contact hole 87.

As a result, the node contact hole 87 may penetrate the upper interlayer dielectric layer 85 and the intermediate interlayer dielectric layer 65 to expose the first landing pad 56. In addition, the bit line spacer 79, the partially remaining landing pad 57R, and/or the plug spacer 69 may be exposed on the sidewalls of the node contact hole 87. In this case, the bit line spacer 79, the partially remaining landing pad 57R, and the plug spacer 69 have etch selectivities with respect to the upper interlayer dielectric layer 85 and the intermediate interlayer dielectric layer 65. Accordingly, the metal silicide layer 57S may be protected from the isotropic etching process.

A node contact spacer 89 may be formed on the sidewalls of the node contact hole 87. The node contact spacer 89 may be formed of an insulating material layer selected from the group consisting of a silicon oxide layer, a silicon oxynitride layer, a silicon nitride layer, and a combination layer thereof.

A node contact conductive layer may be formed to fill the node contact hole 87 and cover the upper interlayer dielectric layer 85. The node contact conductive layer may be planarized to form a node contact plug 96. A CMP process or etch-back process may be applied for the planarization. A storage node 97 contacting the node contact plug 96 may be formed on the upper interlayer dielectric layer 85.

As described above, according to the present embodiment, the metal silicide layer 57S may be formed lower than the plug spacer 69. Accordingly, while the node contact hole 87 is formed, the plug spacer 69 and/or the partially remaining landing pad 57R act to prevent the metal silicide layer 57S from being exposed and etched. That is, the designed contact area between the metal silicide layer 57S and the contact plug 74 may be protected against inadvertent etching. The conductive line 77 may be electrically connected to the semiconductor substrate 51 via the contact plug 74, the metal silicide layer 57S, and the second landing pad 57. The metal silicide layer 57S may act to reduce a contact resistance between the contact plug 74 and the second landing pad 57. Consequently, an interconnection resistance between the conductive line 77 and the semiconductor substrate 51 may be adjusted.

Hereinafter, another method of fabricating a semiconductor device according to an exemplary embodiment will be described with reference to FIGS. 4, 13 and 14.

Referring to FIGS. 4 and 13, the exposed upper region of the second landing pad 57 is selectively removed to form a lower contact hole 67 larger than the upper contact hole 66 as described with reference to FIG. 8. An isotropic etching process may be applied to selectively remove the exposed upper region of the second landing pad 57. For example, the isotropic etching process may include a process condition which can remove by etching a film-forming material of the second landing pad 57, i.e., a polysilicon layer, by 5 nm or more.

While the lower contact hole 67 is formed, an upper corner region of the second landing pad 57 may be completely removed. In addition, the lower contact hole 67 preferably exposes sidewalls of the second landing pad hole 57H. That is, the lower interlayer dielectric layer 55 may be exposed on the sidewalls of the second landing pad hole 57H by the lower contact hole 67.

As a result, the upper contact hole 66 and the lower contact hole 67 may be connected to each other to constitute a contact hole 68. In addition, the second landing pad 57 may be recessed downward to remain below the contact hole 68.

Referring to FIGS. 4 and 14, the same method as that described with reference to FIGS. 9 to 12 may be employed to form a plug spacer 69, a metal silicide layer 57S, a contact plug 74, a conductive line 77, and an upper interlayer dielectric layer 85. Hereinafter, the same method as that described with reference to FIG. 5 may be employed to form a node contact plug 96 and a storage node 97.

According to the embodiments described above, first and second landing pads are disposed through a lower interlayer dielectric layer to be in contact with a semiconductor substrate. Top surfaces of the first landing pad and the lower interlayer dielectric layer are exposed on substantially the same plane. In contrast, the top surface of the second landing pad is disposed lower than the top surface of the first landing pad. A metal silicide layer is disposed on the second landing pad. The metal silicide layer is also disposed lower than the top surface of the first landing pad. An intermediate interlayer dielectric layer is disposed on the lower interlayer dielectric layer. A conductive line is disposed on the intermediate interlayer dielectric layer. A contact plug is disposed between the conductive line and the metal silicide layer. The contact plug penetrates the intermediate interlayer dielectric layer to extend into the lower interlayer dielectric layer. Accordingly, while a node contact hole exposing the first landing pad is formed, the metal silicide layer may be securely against inadvertent etching.

In addition, sidewalls of the contact plug are surrounded by a plug spacer. The plug spacer also acts to prevent the metal silicide layer from being exposed and etched.

Consequently, the designed contact area between the metal silicide layer and the contact plug may be protected against inadvertent etching. That is, a semiconductor device capable of controlling the contact resistance between the conductive line and the second landing pad may be realized.

Exemplary embodiments have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a semiconductor substrate;
   a lower interlayer dielectric layer disposed on the semiconductor substrate;
   a first landing pad contacting the semiconductor substrate through the lower interlayer dielectric layer;
   a second landing pad contacting the semiconductor substrate through the lower interlayer dielectric layer, and spaced apart from the first landing pad;
   a metal silicide layer formed on the second landing pad and disposed lower than a top surface of the first landing pad;
   an intermediate interlayer dielectric layer disposed on the lower interlayer dielectric layer;
   a conductive line disposed on the intermediate interlayer dielectric layer; and
   a contact plug disposed between the conductive line and the metal silicide layer, wherein an upper end of the metal silicide layer is located below the top surface of the first landing pad.

2. The semiconductor device according to claim 1, further comprising:
   a plug spacer surrounding sidewalls of the contact plug,
   wherein the plug spacer penetrates the intermediate interlayer dielectric layer along the sidewalls of the contact plug to extend into the lower interlayer dielectric layer.

3. The semiconductor device according to claim 2, wherein the plug spacer is a material layer having an etch selectivity with respect to the intermediate interlayer dielectric layer and the lower interlayer dielectric layer.

4. The semiconductor device according to claim 2, wherein the metal silicide layer is disposed below the plug spacer.

5. The semiconductor device according to claim 1, wherein the contact plug includes:
   an upper plug penetrating the intermediate interlayer dielectric layer; and
   a lower plug extending below the upper plug and disposed in the lower interlayer dielectric layer, and having a width larger than the upper plug.

6. The semiconductor device according to claim 5, wherein the lower plug has a substantially spherical shape.

7. The semiconductor device according to claim 5, further comprising:
   a barrier metal layer surrounding sidewalls of the upper plug and sidewalls and a bottom surface of the lower plug.

8. The semiconductor device according to claim 1, wherein the metal silicide layer is a material selected from the group consisting of WSi, TiSi, NiSi, MoSi, ZrSi, PtSi, IrSi, and TaSi.

9. The semiconductor device according to claim 1, further comprising:
   an upper interlayer dielectric layer covering the conductive line and the intermediate interlayer dielectric layer;
   a storage node disposed on the upper interlayer dielectric layer; and
   a node contact plug disposed between the first landing pad and the storage node.

10. The semiconductor device according to claim 9, further comprising:
    a node contact spacer surrounding sidewalls of the node contact plug,
    wherein the node contact spacer is an insulating material layer.

11. A semiconductor device, comprising:
    a semiconductor substrate;
    an interlayer dielectric layer disposed on the semiconductor substrate;
    a first landing pad contacting the semiconductor substrate through the interlayer dielectric layer;
    a second landing pad contacting the semiconductor substrate through the interlayer dielectric layer, the second landing pad spaced apart from the first landing pad;
    a metal silicide layer formed on the second landing pad and disposed lower than a top surface of the first landing pad;
    a conductive line disposed on the interlayer dielectric layer; and
    a contact plug disposed between the conductive line and the metal silicide layer, wherein an upper end of the metal silicide layer is located below the top surface of the first landing pad.

* * * * *

UNITED STATES PATENT AND TRADEMARK OFFICE
CERTIFICATE OF CORRECTION

PATENT NO.        : 7,476,924 B2  
APPLICATION NO.   : 11/550553  
DATED             : January 13, 2009  
INVENTOR(S)       : Je-Min Park et al.

Page 1 of 1

Figure 3:
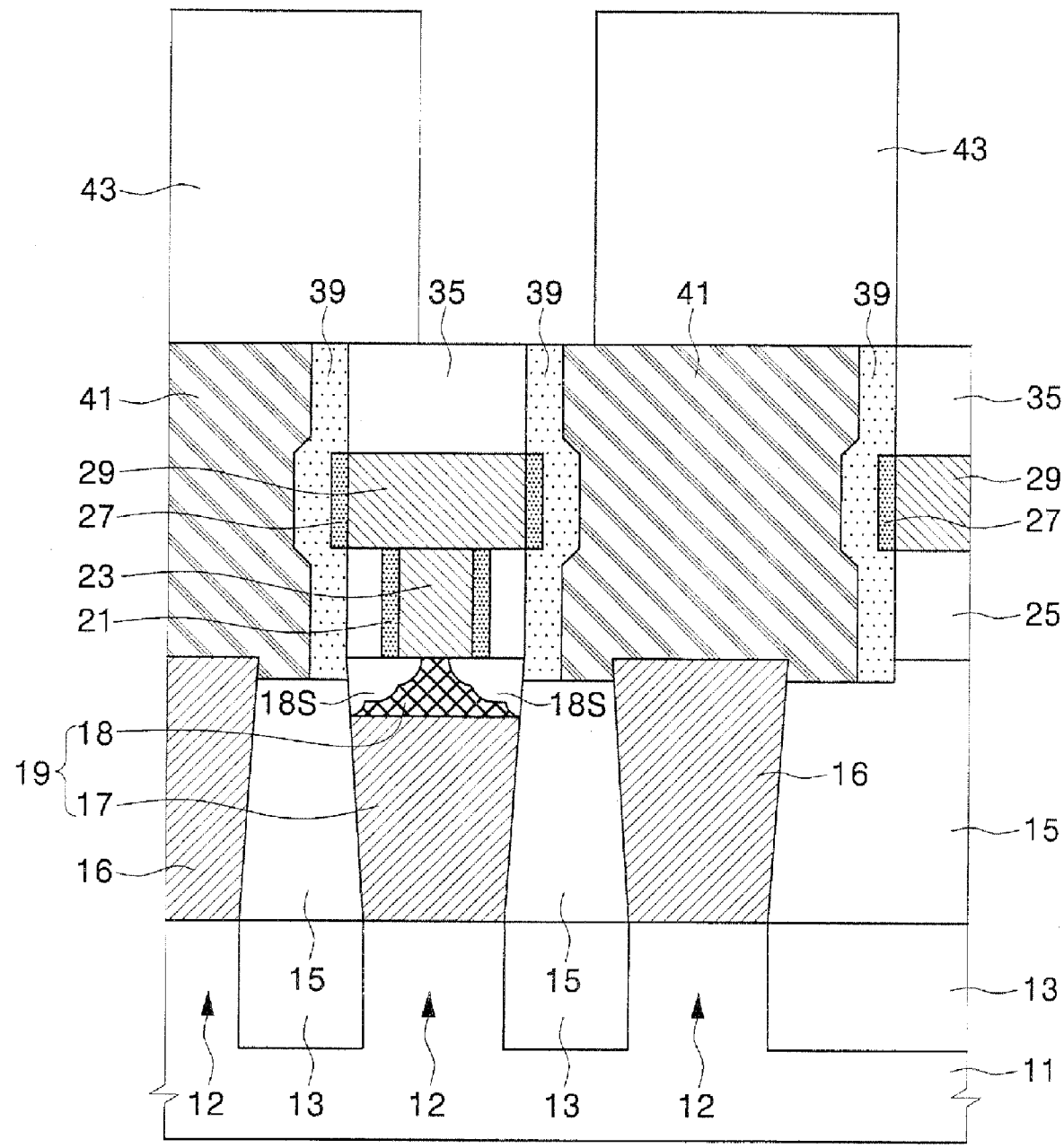

It is certified that error appears in the above-identified patent and that said Letters Patent is hereby corrected as shown below:

Column 2, line 10, the word "layer" should read -- layer 15 --;  
Column 2, line 19, the words "FIG. 3" should read -- FIG. 3, --.

Signed and Sealed this

First Day of September, 2009

David J. Kappos  
*Director of the United States Patent and Trademark Office*